(12) United States Patent
Lin et al.

(10) Patent No.: US 6,292,372 B1
(45) Date of Patent: Sep. 18, 2001

(54) SOLDER THIEVING PAD FOR WAVE SOLDERED THROUGH-HOLE COMPONENTS

(75) Inventors: Kon M. Lin, Pennington, NJ (US); Quentin D. Groves; Albert W. Robinson, both of Oklahoma City, OK (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/353,386

(22) Filed: Jul. 15, 1999

(51) Int. Cl.[7] ...................................................... H05K 3/34
(52) U.S. Cl. .......................... 361/760; 361/764; 361/765; 361/767; 361/774; 361/807; 361/808; 174/250; 174/262; 174/263; 174/266; 228/180.21; 228/180.1
(58) Field of Search .................................. 361/760, 764, 361/765, 767, 772, 774, 807, 808, 810; 174/250, 262, 263, 266; 228/180.21, 180.1

(56) References Cited

U.S. PATENT DOCUMENTS

| 4,339,784 | * | 7/1982 | Shearer | 361/767 |
|---|---|---|---|---|
| 4,835,345 | | 5/1989 | Haarde | 174/263 |
| 4,851,614 | * | 7/1989 | Duncan, Jr. | 174/68.5 |
| 4,893,216 | * | 1/1990 | Hagner | 361/774 |
| 5,155,904 | * | 10/1992 | Majd | 29/837 |
| 5,227,589 | * | 7/1993 | Weeks | 174/263 |
| 5,243,143 | * | 9/1993 | Throop et al. | 174/263 |
| 5,414,223 | | 5/1995 | Suski et al. | 174/262 |
| 5,604,333 | * | 2/1997 | Kennish et al. | 174/261 |
| 5,679,929 | | 10/1997 | Greenfield et al. | 174/261 |
| 5,736,680 | * | 4/1998 | Caldwell et al. | 174/250 |

* cited by examiner

Primary Examiner—Jeffrey Gaffin
Assistant Examiner—David Foster
(74) Attorney, Agent, or Firm—Morgan & Finnegan, LLP

(57) ABSTRACT

An improved robber or solder thieving pad, parallelogram shaped, significantly reduces solder bridging in wave soldered multi leaded through hole or surface mounted components in a printed circuit board for different wave settings. The component leads are either parallel or perpendicular to the solder wave during the soldering process. In one embodiment, the parallelogram shaped solder thieving pad is disposed contiguous or adjacent to the through hole. In another embodiment, the parallelogram shaped solder thieving pad is spaced from a thin annular ring surrounding the through-hole. In still another embodiment, the pad may be linked to the ring by a thin connecting bridge. Dimensions of the solder thieving pad vary according to the component lead size, spacing, and number of rows. The design of the pad takes into account the total molten solder volume held in a solder joint and balances the weight of the solder volume, the dynamic solder flow in the wave; and the solder surface tension for improving the drainage behavior of the solder to inhibit solder bridging of the component leads.

20 Claims, 12 Drawing Sheets

FIG. 5

| COMPONENT TYPE | COMP/BD | PAD TYPES | COMP/PAD TYPE/BD | JOINTS/PAD TYPE/BD | TOTAL JOINTS/PAD TYPE/WAVE SETTING* |
|---|---|---|---|---|---|
| 100 LEADED EDGE CONNECTOR | 8 | 2 | 4 | 400 | 20000/18800 |
| 30-PIN HEADER | 24 | 2 | 12 | 360 | 18000/16920 |
| 20-LEADED LFR | 32 | 2 | 16 | 320 | 16000/15040 |
| 15-LEADED ZIGZAG CONNECTOR | 36 | 2 | 18 | 270 | 13500/12690 |

*NUMBER OF TEST BOARDS = 50 AT 0.030" WAVE HEIGHT SETTING
*NUMBER OF TEST BOARDS = 47 AT 0.096" WAVE HEIGHT SETTING

FIG. 6

|  | REGULAR MOUNTING PADS | | | | MOUNTING PADS WITH SOLDER THIEVES | | | |
|---|---|---|---|---|---|---|---|---|
| NO OF. BOARDS | 100 LEADED EDGE CONN. | 30 PIN HEADER | 20 LEADED LFR | 15 LEADED ZIGZAG CONN. | 100 LEADED EDGE CONN. | 30 PIN HEADER | 20 LEADER LFR | 15 LEADED ZIGZAG CONN. |
| TOTAL= 50 | 120 | 138 | 0 | 1397 | 4 | 21 | 44 | 2 |
| TOTAL NO. OF JTS. | 20000 | 18000 | 16000 | 13500 | 20000 | 18000 | 16000 | 13500 |
| % JT. DEFECT | 0.60 | 0.77 | 0 | 10.35 | 0.02 | 0.12 | 0.28 | 0.01 |
| AVG. DEF./BD. $\bar{x}$ | 2.40 | 2.76 | 0 | 27.94 | 0.08 | 0.42 | 0.88 | 0.04 |
| STD. DEV./BD. $\sigma$ | 1.92 | 2.29 | 0 | 5.28 | 0.27 | 0.57 | 0.99 | 0.20 |
| CONFIDENCE/BD. | 0.45 | 0.53 | -- | 1.23 | 0.06 | 0.13 | 0.23 | 0.05 |

|  | REGULAR MOUNTING PADS | | | | MOUNTING PADS WITH SOLDER THIEVES | | | |
|---|---|---|---|---|---|---|---|---|
| NO OF. BOARDS | 100 LEADED EDGE CONN. | 30 PIN HEADER | 20 LEADED LFR | 15 LEADED ZIGZAG CONN. | 100 LEADED EDGE CONN. | 30 PIN HEADER | 20 LEADER LFR | 15 LEADED ZIGZAG CONN. |
| TOTAL= 47 | 104 | 180 | 0 | 1277 | 7 | 61 | 52 | 2 |
| TOTAL NO. OF JTS. | 18800 | 16920 | 15040 | 12690 | 18800 | 16920 | 15040 | 12690 |
| % JT. DEFECT | 0.55 | 1.06 | 0 | 10.06 | 0.04 | 0.36 | 0.35 | 0.02 |
| AVG. DEF./BD. $\bar{x}$ | 2.21 | 3.83 | 0 | 27.17 | 0.15 | 1.30 | 1.11 | 0.04 |
| STD. DEV./BD. $\sigma$ | 1.76 | 3.69 | 0 | 4.05 | 0.36 | 2.01 | 1.10 | 0.20 |
| CONFIDENCE/BD. | 0.42 | 0.89 | -- | 0.97 | 0.09 | 0.48 | 0.26 | 0.05 |

FIG. 11A

| # BOARDS | HEADERS/PWB | COMPONENT LEAD PLATING | PROTRUSION |
|---|---|---|---|
| 14 | 80 | Sn/Pb | .028" |

| # | EXCESSIVE SOLDER ||||| BRIDGING |||||
|---|---|---|---|---|---|---|---|---|---|---|
|   | A | B | C | D | E | A | B | C | D | E |
| 1  | ◎ | ⌒ 12 | ∨ 2 | ◇ 3 | △ 10 | ◎ | ⌒ | ∨ | ◇ | △ |
| 2  | ◎ | ⌒ 8 | ∨ 5 | ◇ 8 | △ 8 | ◎ | ⌒ | ∨ | ◇ | △ |
| 3  | ○ 1 | ⌒ 8 | ∨ 3 | ◇ 8 | △ 6 | ○ | ⌒ | ∨ | ◇ | △ |
| 4  | ○ | ⌒ 11 | ∨ 6 | ◇ 6 | △ 6 | ○ | ⌒ | ∨ | ◇ | △ |
| 5  | ⌒ 10 | ∨ 3 | ◇ 6 | △ 6 | ◎ | ⌒ | ∨ | ◇ | △ | ◎ |
| 6  | ⌒ 11 | ∨ 1 | ◇ 4 | △ 4 | ◎ | ⌒ | ∨ | ◇ | △ | ◎ |
| 7  | ⌒ 10 | ∨ 2 | ◇ 5 | △ 5 | ○ | ⌒ | ∨ | ◇ | △ | ○ |
| 8  | ⌒ 7 | ∨ 1 | ◇ 8 | △ 8 | ○ | ⌒ | ∨ | ◇ | △ | ○ |
| 9  | ∨ 2 | ◇ 2 | △ 5 | ◎ | ⌒ 11 | ∨ | ◇ | △ | ◎ | ⌒ |
| 10 | ∨ 2 | ◇ 2 | △ 9 | ◎ | ⌒ 7 | ∨ | ◇ | △ | ◎ | ⌒ |
| 11 | ∨ 4 | ◇ 4 | △ 10 | ○ | ⌒ 10 | ∨ | ◇ | △ | ○ | ⌒ |
| 12 | ∨ 2 | ◇ 1 | △ 7 | ○ | ⌒ 11 | ∨ | ◇ | △ | ○ | ⌒ |
| 13 | ◇ 2 | △ 2 | ◎ 1 | ⌒ 11 | ∨ 6 | ◇ | △ | ◎ | ⌒ 1 | ∨ |
| 14 | ◇ 5 | △ 1 | ◎ | ⌒ 12 | ∨ 1 | ◇ | △ | ◎ | ⌒ | ∨ |
| 15 | ◇ 4 | △ 4 | ○ | ⌒ 9 | ∨ 4 | ◇ | △ | ○ | ⌒ | ∨ |
| 16 | ◇ 4 | △ 6 | ○ | ⌒ 11 | ∨ 6 | ◇ | △ | ○ | ⌒ | ∨ |

FIG. 11B

| # BOARDS | HEADERS/PWB | COMPONENT LEAD PLATING | PROTRUSION |
|---|---|---|---|
| 9 | 80 | Sn/Pb | .028" |

| | EXCESSIVE SOLDER | | | | | BRIDGING | | | | |
|---|---|---|---|---|---|---|---|---|---|---|
| # | A | B | C | D | E | A | B | C | D | E |
| 1 | ◎ | ⌒ 4 | ∨ 2 | ◇ 2 | ∧ | ◎ | ⌒ | ∨ | ◇ | ∧ |
| 2 | ◎ | ⌒ 5 | ∨ 1 | ◇ | ∧ | ◎ | ⌒ | ∨ | ◇ | ∧ |
| 3 | ○ | ⌒ 5 | ∨ 1 | ◇ 1 | ∧ | ○ | ⌒ | ∨ 1 | ◇ | ∧ |
| 4 | ○ | ⌒ 5 | ∨ 5 | ◇ | ∧ | ○ | ⌒ | ∨ | ◇ | ∧ |
| 5 | ⌒ 6 | ∨ | ◇ 5 | ∧ 2 | ◎ | ⌒ | ∨ | ◇ | ∧ | ◎ |
| 6 | ⌒ 6 | ∨ 1 | ◇ 6 | ∧ | ◎ | ⌒ | ∨ | ◇ | ∧ | ◎ |
| 7 | ⌒ 5 | ∨ | ◇ 4 | ∧ | ○ | ⌒ | ∨ | ◇ | ∧ | ○ |
| 8 | ⌒ 6 | ∨ | ◇ 4 | ∧ | ○ | ⌒ | ∨ | ◇ | ∧ | ○ |
| 9 | ∨ | ◇ 1 | ∧ 5 | ◎ 1 | ⌒ 7 | ∨ | ◇ | ∧ | ◎ 1 | ⌒ |
| 10 | ∨ | ◇ 1 | ∧ 4 | ◎ 1 | ⌒ 6 | ∨ | ◇ | ∧ | ◎ | ⌒ |
| 11 | ∨ | ◇ | ∧ 4 | ○ | ⌒ 6 | ∨ | ◇ | ∧ 1 | ○ | ⌒ |
| 12 | ∨ | ◇ 1 | ∧ 4 | ○ 1 | ⌒ 7 | ∨ | ◇ | ∧ | ○ | ⌒ |
| 13 | ◇ | ∧ | ◎ | ⌒ 5 | ∨ | ◇ | ∧ | ◎ 1 | ⌒ | ∨ |
| 14 | ◇ | ∧ | ◎ 1 | ⌒ 5 | ∨ | ◇ | ∧ | ◎ | ⌒ | ∨ |
| 15 | ◇ | ∧ | ○ 2 | ⌒ 5 | ∨ | ◇ | ∧ | ○ | ⌒ | ∨ |
| 16 | ◇ | ∧ | ○ 1 | ⌒ 5 | ∨ | ◇ | ∧ | ○ | ⌒ | ∨ |

SOLDER THIEVING PAD FOR WAVE SOLDERED THROUGH-HOLE COMPONENTS

BACKGROUND OF INVENTION

1. Field of Invention

This invention relates to printed circuit boards for electronic devices. More particularly, the invention relates to a device and method for minimizing bridging across the leads of integrated circuits, connectors or other closely spaced through-hole-components soldered to the board with the leads parallel to a soldering wave during a wave soldering process 2. Description of the Prior Art Through-Hole Components (THC) wave soldered to Printed Wiring Boards (PWBs) continue to be used in many circuit packs designs. There is a need to continue to find ways to further reduce wave soldering defects for increasingly dense circuit packs. Through-hole components, such as connectors or sockets widely used on input/output boards for mechanical strength and cost reasons are very difficult to wave solder without high incidence of solder crosses. Because of this difficulty, most design guides require the longitudinal axes of the components along the longest row of leads to be oriented parallel to with the board direction passing through the solder wave. However, this requirement often imposes a severe handicap on board designers in placing components and routing circuitry for many high density boards. Quite often designers have to use a board with a higher layer count, a larger board, or two boards instead of one. The inefficient use of board real estate not only increases the cost of the product but also reduces their electrical and thermal performance. Moreover, some edge connectors can only be placed with their longest lead rows parallel to with the soldering wave or perpendicularly or in a "misoriented" direction to the board travel direction, violating required design rules. These "Disoriented" parts inevitably cause high incidence of solder crosses that need to be repaired. Sometimes they impede cooling current flow and generally result in less efficient use of circuit board real estate. Thieving pads on printed wiring boards have been used to reduce the amount of solder crosses in a wave soldering process for many years. However, the emphasis of their use has largely been placed on wave soldering of surface mounted components. Earlier attempts at using this method on through-hole components were not very successful for production purposes. Accordingly, a need exists for an improved solder thieving pad on printed circuit boards for wave soldered through-hole components where the leads of the components are parallel to with the soldering wave or perpendicular to the board direction passing through the soldering wave during the soldering operation.

Prior art related to thieving pads includes the following:

U.S. Pat. No. 5,736,680 entitled "Polymorphic Rectilinear Thieving Pad" to B. E. Caldwell et al., issued Apr. 7, 1998 (Caldwell) discloses a pad adjacent to a through-hole that will be located on the trailing edge of the board when the board is processed through wave soldering. The pad includes a curved side that faces the hole. In addition, corners are absent from the pad. The intersection of sides of the pad occurs as a curve or radiuses corner rather than a vertical corner. Wave soldering the printed circuit board with the pad reduces environmental conditions that induce bridging of a lead inserted into the hole adjacent the pad.

U.S. Pat. No. 5,679,929 entitled "Anti-Bridging Pads for Printed Circuit Boards and Interconnecting Substrates" to D. W. Greenfield et al., issued Oct. 21, 1997 (Greenifield) discloses anti-bridging pads for wave soldering of interconnecting substrates. The anti-bridging pads are disposed adjacent to trailing pads surrounding through holes and have geometries and/or placements with respect to the trailing pads in an array of functional pads which reduce or eliminate solder bridging.

U.S. Pat. No. 5,604,333 entitled "Process and Structure for a Solder Thief on Circuit Boards" to R. A. Keninish et al., issued Feb. 18, 1997 (Kennisli) discloses the formation of solder bridges between pads on circuit boards is minimized by a process and structure for wicking excess solder deposited during a wave soldering process. Solder thieves are placed adjacent to a last pad of a series of pads and are approximately the same width and twice the length as the pad in order to provide sufficient wicking of the solder. The excess solder is formed on the solder thieves and solder bridges are prevented.

U.S. Pat. No. 4,835,345 entitled "Printed Wiring Board Having Robber Pads for Excess Solder" to J. F. Haarde, issued May 30, 1989 (Haarde) discloses a printed wiring board which has one or more solder thieving pads of special configuration which receive and contain excess solder which might otherwise bridge adjacent downstream leads of a component having closely spaced leads when the component is mounted to the printed circuit board in a wave soldering process. The special solder thieving pad configuration may be viewed as an extra solder thieving pad (a "robber pad") at the downstream end of a linear array of solder thieving pads which is connected to the adjacent upstream solder thieving pad by a solder-wettable bridge.

U.S. Pat. No. 5,227,589 entitled "Plated-Through Interconnect Solder Thief" to A. R. Weeks, issued Jul. 13, 1993 (Weeks) discloses a plated-through hole solder thief for inhibiting solder bridges between adjacent leads of an integrated circuit and simultaneously providing for electrical interconnections of certain leads of the integrated circuit to other surfaces or layers of a printed wiring board. Plated through-holes are used as solder thieves and are located in the proximity of the last solder thieving pad in a row of solder thieving pads. The plated through-hole draws the solder the last solder thieving pad to fill the plated through-hole and inhibit bridging between functional leads of the integrated circuit as well as make an electrical interconnection between the last lead of the integrated circuit in each row and other surfaces or layers of the printed wiring board. The plated-through hole is located askew from the rows of solder thieving pads so that functional use may be made of the plated-through hole once it is filled to provide a test point for testing the integrated circuit.

U.S. Pat. No. 5,414,223 entitled "Solder thieving pad for Printed Circuit Boards" to E. D. Suski et al., issued May 9, 1995 (Suski) discloses an omni-directional non-occluding solder thieving pad design for printed circuit boards comprising a plurality of spokes radiating outward from a through-hole on a printed circuit board, with a ring concentric to the through-hole that intersects each of the plurality of spokes at approximately a perpendicular angle. The ring-spoke configuration eliminates tile need to insure proper orientation of tile solder thieving pad on the printed circuit board prior to a wave soldering process since the symmetrical ring-spoke design is omni-directional. The concentric ring structure provides an additional contact area of solder between the printed circuit board and the computer chassis. This additional contact of solder ensures that there is sufficient electrical connection between the printed circuit board and tile computer chassis such that when the printed circuit board is mounted to tile computer chassis, a proper grounding connection is provided.

None of the prior art discloses a multi leaded THC in a copper surfaced printed circuit board having solder thieving pads of a single simple geometry for all types of component leads and configuration in all types of board surface finishes which reduce "bridging" while tile thieving pads are parallel to a soldering wave or perpendicular or in a "misoriented" direction to the board travel direction in a wave soldering process, the pads taking into account the total molten solder volume held in tile solder joint; balancing the weight of the solder volume, the dynamic solder flow in the wave and the solder surface tension to improve the drainage behavior of the solder to inhibit solder bridging of the component leads.

SUMMARY OF THE INVENTION

An object of the invention is a solder thieving pad and method for inhibiting solder bridges between adjacent leads of a component wave soldered to a PWB with the leads parallel or perpendicular to the solder wave during the soldering process.

Another object is a parallelogram shaped solder thieving pad disposed contiguous or adjacent to a THC in a PWB and minimizing tile number of solder crosses among the leads of the component during a wave soldering process, the long axis of the leads being disposed perpendicularly to the direction of travel of the PWB during the soldering process.

Another object is a parallelogram-shaped thieving pad and connecting bridge disposed adjacent to a THC in a PWB to minimize solder bridging of component leads and promote even better solder drainage of molten solder held among adjacent leads of the component during a wave soldering process.

These and other objects, features and advantages are achieved in an improved "robber" or thieving solder thieving pad disposed adjacent to either multi-leaded through-hole or Surface Mounted (SMC) components in a printed circuit board and reducing "bridging" of the leads during a wave soldering process, in which the leads are parallel to the soldering wave during the soldering process. In one embodiment the solder thieving pad is disposed in contiguous or spaced relation to the THC leads. In another embodiment, each through-hole includes a thin surrounding ring or surface mounted pad and a spaced or attached parallelogram shaped solder thieving pad. In still another embodiment, the pad may be linked to the ring by a thin connecting bridge. In all embodiments the THC leads have their longest lead rows parallel to the soldering wave or perpendicularly or in a "disoriented" direction to the board travel direction through the wave soldering process. Dimensions of the solder thieving pad vary according to component lead size, spacing, and number of rows. The design of the pad takes into account the total molten solder volume held in the solder joint and balances the weight of the solder volume, the dynamic solder flow in the wave and the surface tension for determining the solder wave's behavior to inhibit solder bridging of component leads.

DESCRIPTION OF DRAWING

The invention will be further understood from a detailed description of a preferred embodiment, taken in conjunction with the appended drawing, in which:

FIG. 5 is a table of component and solder thieving pads in the wave soldering experiment of FIG. 2.

FIG. 6 is a table summarizing solder cross or "bridging" defects in the wave soldering experiment of FIG. 2.

FIGS. 11A and B are tables of defect data in the experiment of FIG. 8

DESCRIPTION OF A PREFERRED EMBODIMENT

A parallelogram shaped solder thieving pad was identified in two experiments as the preferred configuration of several alternatives for elimination of solder bridging in multi-leaded Through-Hole-Components (THC) wave soldered to a Printed Wire Board (PWB). While the THC were used in the experiments, the principles of the invention are equally applicable to Surface Mounted Components (SMC). For purposes of the experimentation, the THC were disposed on the PWB with their leads in parallel relation to the solder wave as contrasted with standard wave soldering technique in which component leads are disposed in perpendicular relation to the solder wave for reduction of solder bridging between or among the component leads. The experiments identifying the parallelogram shaped solder thieving pad as the most effective solder thieving pad for eliminating "solder bridging" in wave soldering are described hereinafter.

Figure 1:
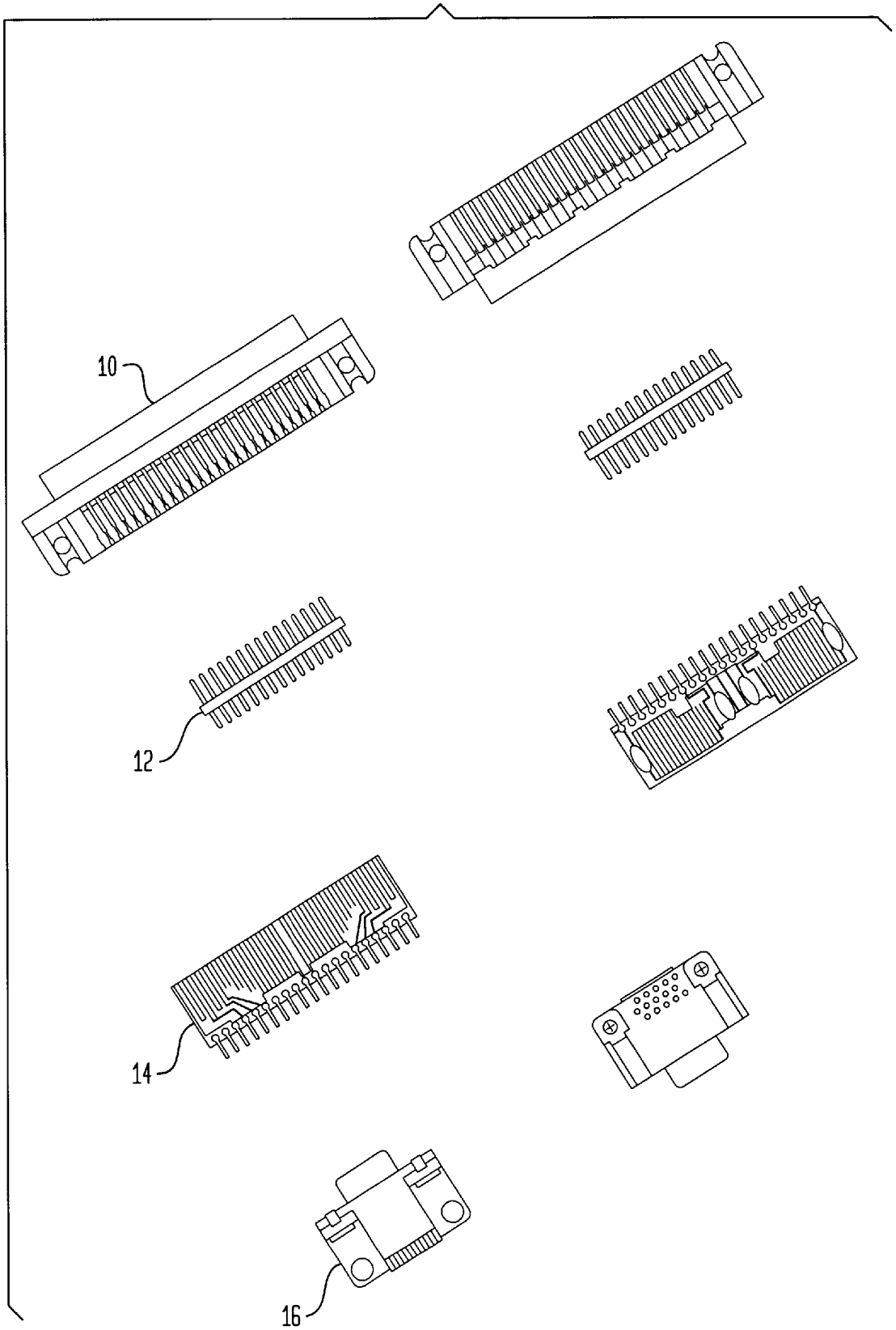
FIG. 1 is a photograph of four (4) Through-Hole-Components (THC) used as test vehicles in a wave soldering experiment confirming the solder thieving pad of the present invention.

FIG. 1 is a top view of four (4) types of THC used in one solder thieving pad experiment for comparison of THC with and without solder thieving pads. A first type of THC was an 100-leaded edge connector 10; a second type was a 30-pin header 12; a third type was a 20-leaded Line Feed Resistor (LFR) network 14; and a fourth type was a 15-leaded zigzag connector 16.

Figure 2:
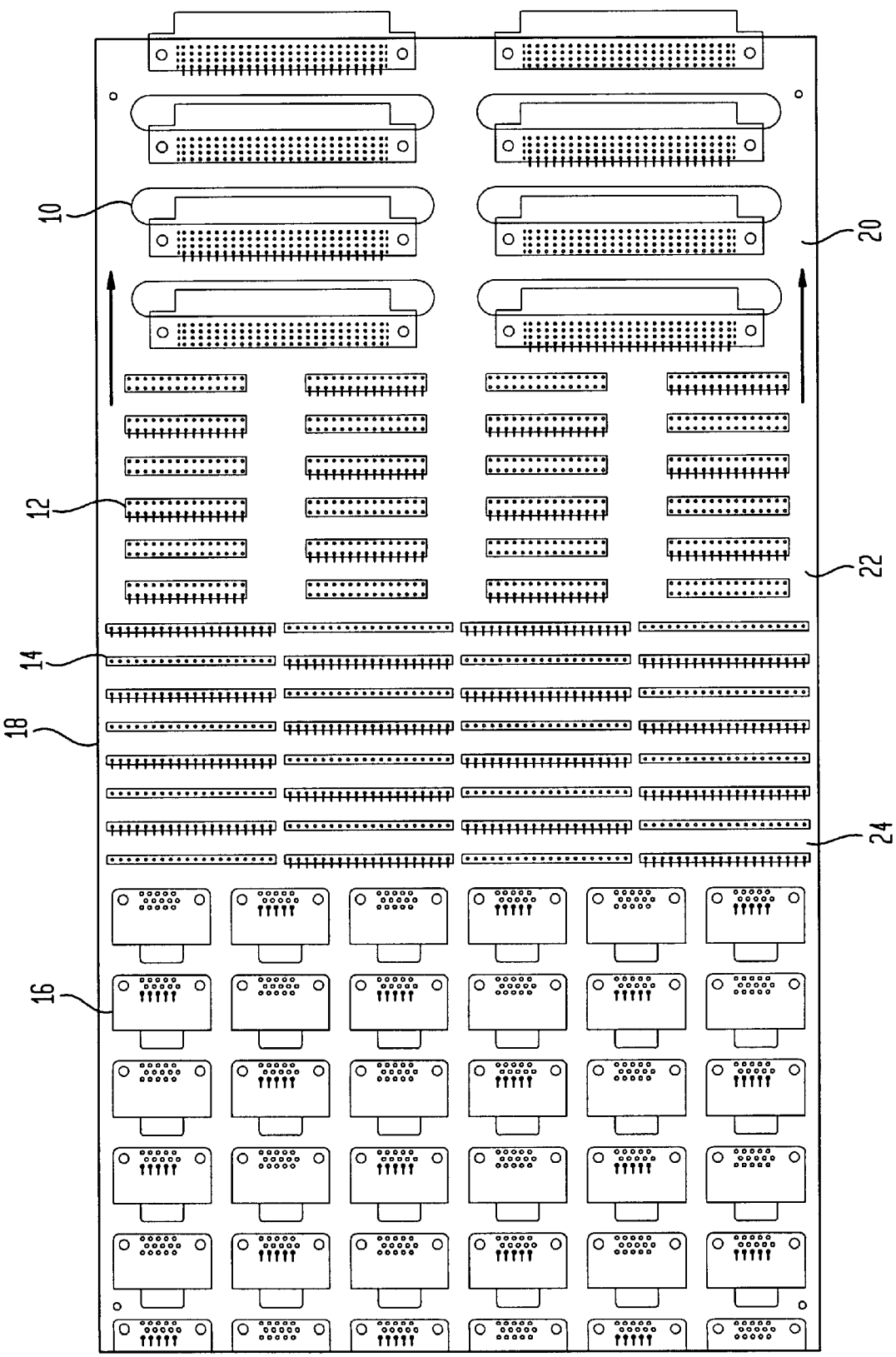
FIG. 2 is a plan view of a Printed Wiring Board (PWB) with the components of FIG. 1 installed for purposes of the wave soldering experiment.

FIG. 2 shows the test components 10, 12, 14 and 16 disposed on a standard PWB 18. The PWB is approximately 8.75 inches wide by 16 inches long. Eight (8) 100 leaded components 10 are disposed in a first section 20 of the PWB, at the leading edge of the wave soldering direction. Twenty-four (24) 30-pin header components 12 are disposed in a second section 22 of the PWB adjacent to the components 10. Thirty-two (32) line Feed Resistor (LFR) networks 14 are disposed in a third section 24 of the PWB, adjacent to the components 12; and thirty-six (36) 15 leaded zigzag connectors 16 are disposed in a fourth section 26 of the PWB, after the components 14. All of the components 10 . . . 16 were installed in the boards with their leads extending through the through holes in the PWB and perpendicular to the travel direction of the PWB through a standard wave soldering process. Half of the through-hole had parallelogram shaped solder thieving pads 30, to be described hereinafter in conjunction with FIG. 3 and half did not. An edge-conveyed assembly line (not shown) fed the board directly into a wave soldering machine. One wave height setting was approximately 0.03 inch and the other was set at about 0.096 inches. The relevant wave soldering set up conditions were as follows and further details of the process are not believed necessary:

| Parameters | |
|---|---|
| Machine Type: | Eletrovert Ultrapak ® 600 M wave soldering machine with nitrogen flow rate of 2400 SCFH at 44 psig. no chip wave used. |
| Wave Height: | 0.030 inch and 0.096 inch (1400 and 1433 rpm pump speeds |
| Preheaters: | At 700°, 700° and 720° F. bottom heater settings and top passive cover |
| Board Top Temperature: | 233° F. |
| Solder & Temperate: | 60 Sn/40 Pb solder at 500° F. |
| Conveyor Speed: | 5 ft/min. |
| Conveyor Angle: | 6.1° from horizontal |
| Flux: | low solid flux |

Figure 3:
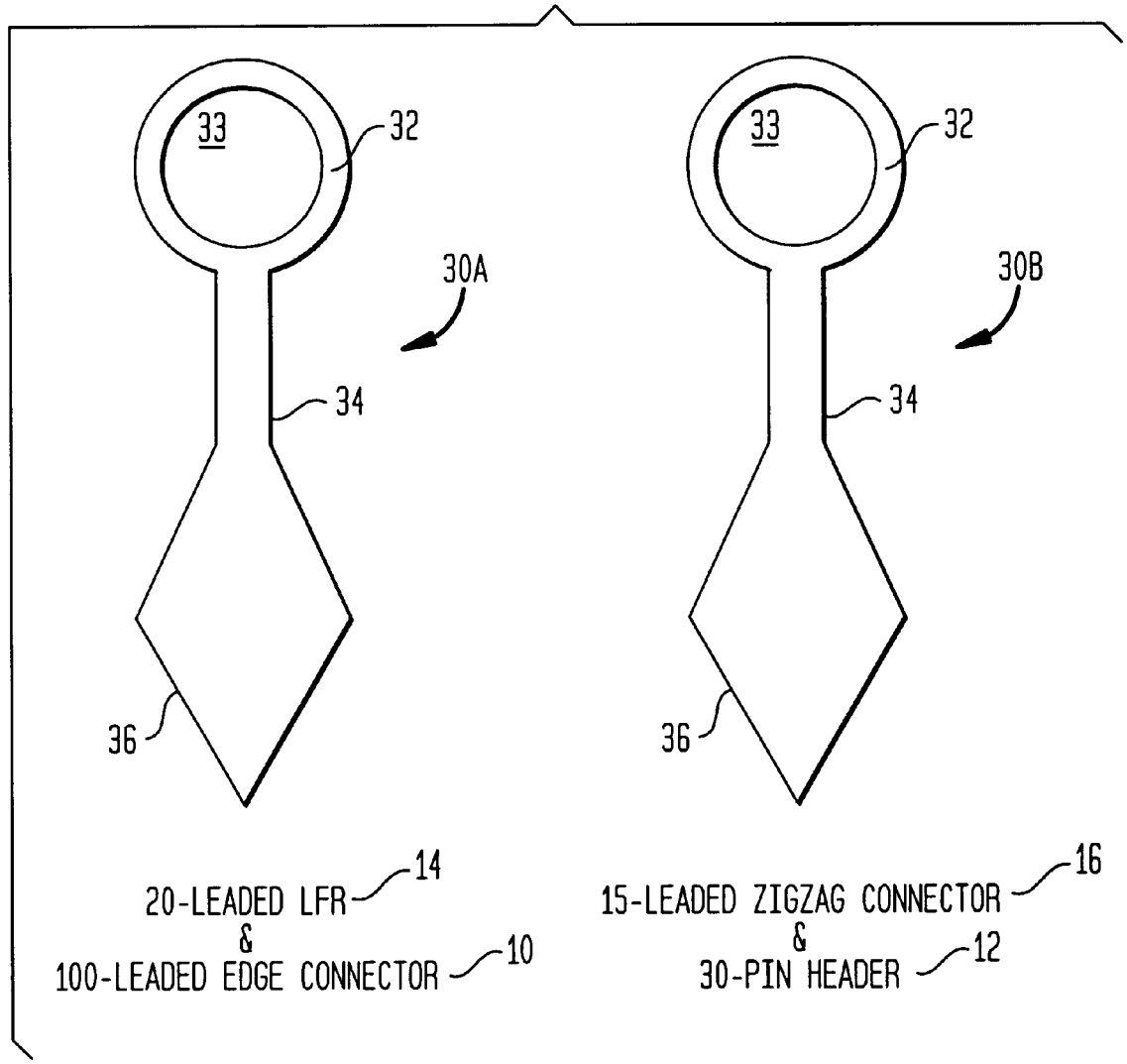
FIG. 3 is a plan view of a solder thieving pad of the present invention which eliminated component lead bridging in the wave experiment of FIG. 2.

FIG. 3 shows one embodiment of a solder thieving pad 30A used in the experiment with the components 10 and 14. The pads include an annular pad 32 formed about a through-hole 33. A thin bridge 34 connects the pad 32 and a parallelogram shaped thieving pad 36. The pad elements 34 and 36 are copper formed by etching a copper coated PWB by well known processes. The solder thieving pad 30B for the component 12 and 16 is identical to the thieving pad 30A, except in minor dimensions due to the construction of the components 12 and 16. In both solder thieving pads, the bridge 34 promotes better solder drainage from a massive volume of molten solder being held among many adjacent leads as in the case of a multi-rowed component with closely spaced leads or wider leads. The configuration of the thieving pad 36 takes into account the total of molten solder volume being held in the joint. The thieving pad balances the weight of the solder volume, the dynamic solder flow in the wave, and the solder surface tension to improve the drainage behavior of the solder and the resultant volume of the solder thieving joint.

Figure 4:
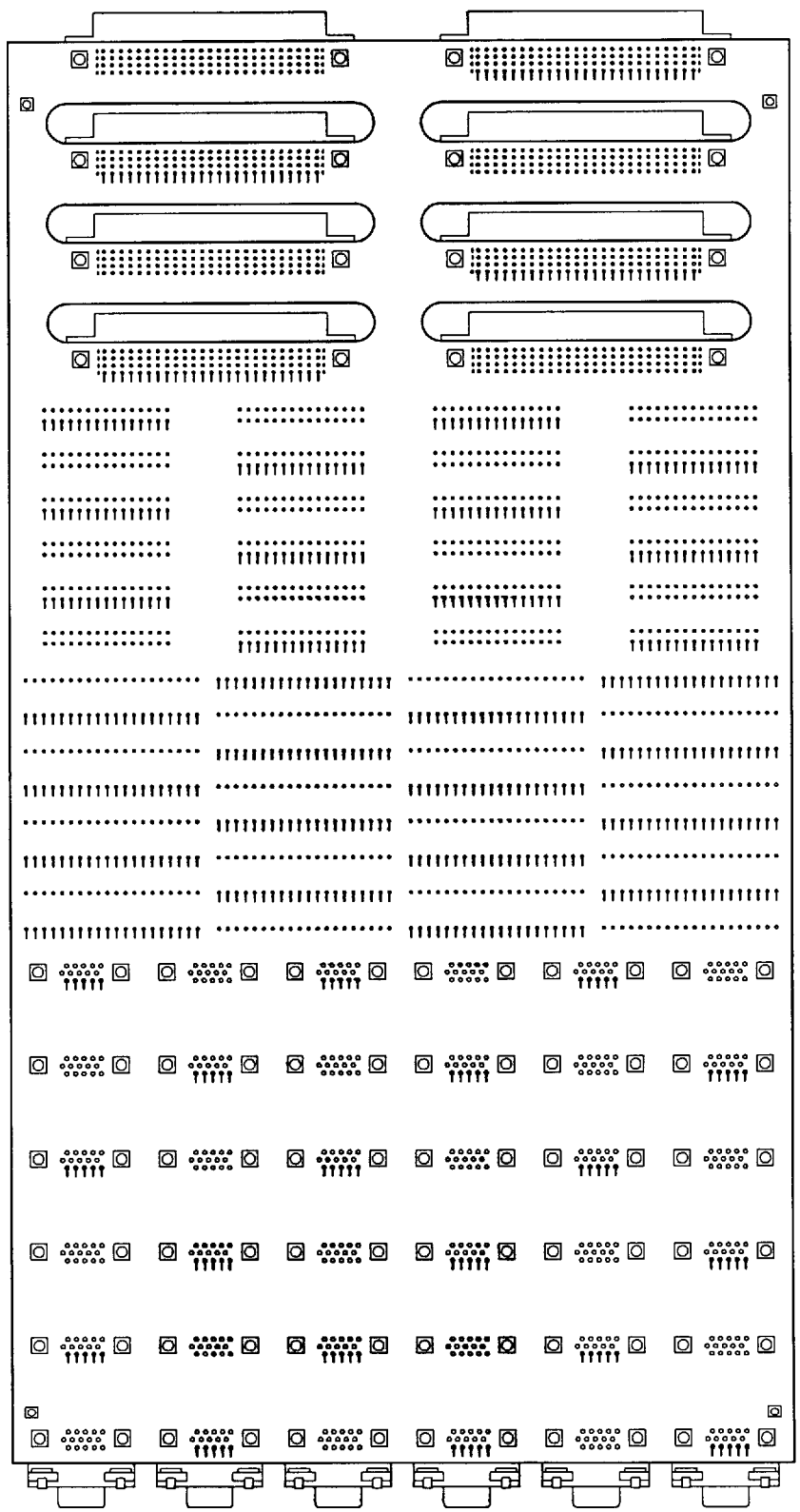
FIG. 4 is a photograph of soldering side of the PWB of FIG. 2 after the wave soldering experiment of FIG. 2.

The experiment was conducted on a regular wave soldering production line operated by the assignee. Two different wave immersions were used to achieve proper vertical hole fill on the topside of the board. One wave setting was at about 0.030 inch, and the other deeper setting was at about 0.096 inch. FIG. 4 shows the soldering side of the PWB after the wave soldering. FIG. 5 show the experimental combination of components and pads as well as the total number of joints for each type of component pad at each wave height setting. The experimental combination gives a variety of wave soldering situations and provides meaningful statistical test results.

FIG. 6 shows the number of solder crosses or bridging for the four (4) types of components 10, 12, 14 and 16, with and without the solder thieves 30A or 30B, as the case may be. The FIG. 6 data shows the clear benefit of the thieving pad of the present invention which practically eliminated solder bridging on the most difficult component, the 15-leaded FIG. 7 is a three-dimensional bar graph and another representation indicating the effects of the solder thieving pad or absence of the pad for the four component types at the two wave settings.

Figure 7:
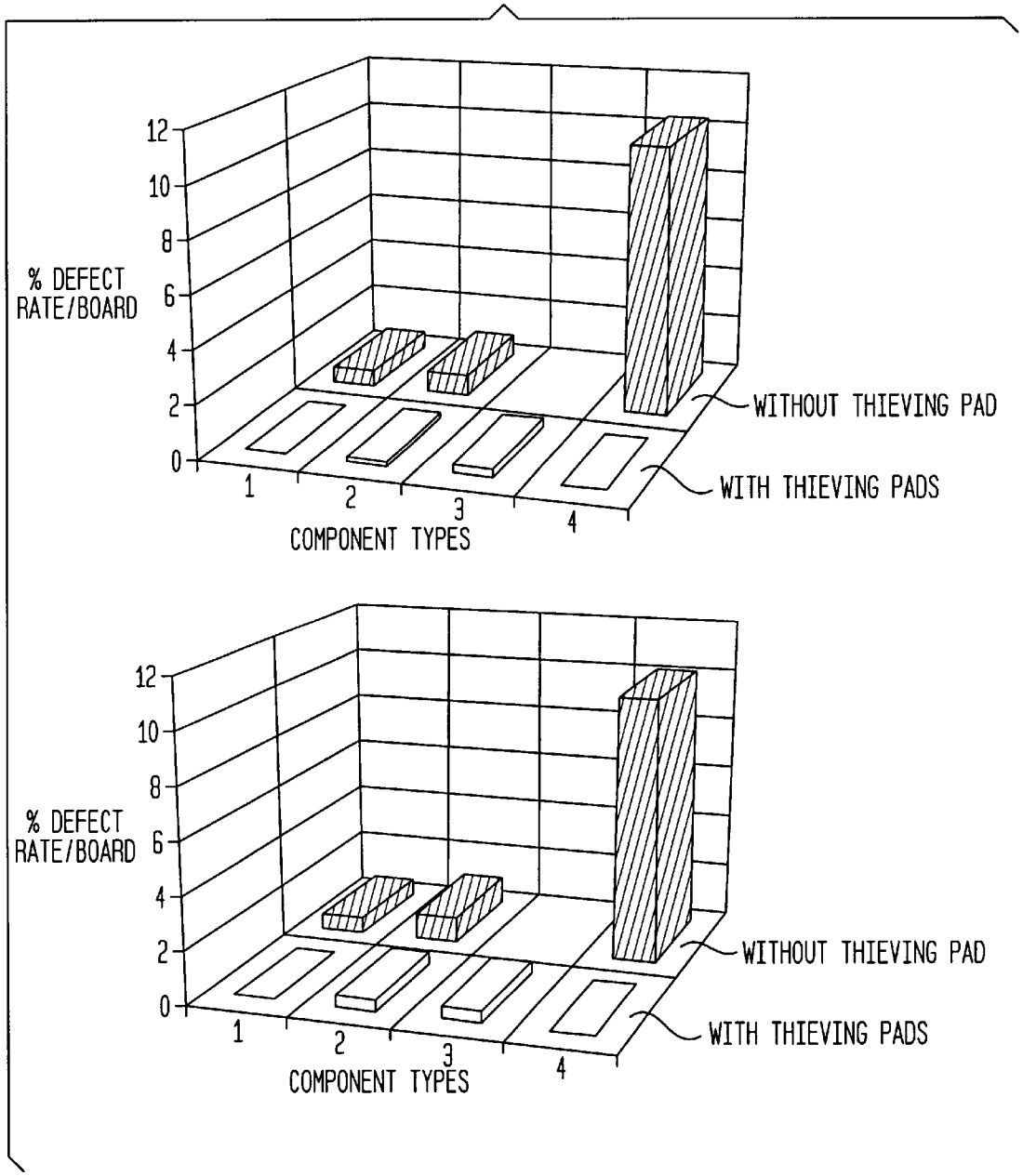
FIG. 7 is a representation of the defects of FIG. 6 for the components of FIG. 1 in a three-dimensional bar graph.

FIGS. 6 and 7 demonstrate the solder thieving pads 30A, 30B are very significant in eliminating solder bridging defects on three components, despite wave soldering the components in an parallel to soldering process. In particular, the solder thieving pads 30B are very effective on the leaded zigzag connector 16. Not only are the defect rates lower for the case with solder thieving pads at both wave height settings, but they have smaller standard deviations and a lot tighter confidence intervals. The thieving pad is also effective for both the 100-leaded edge connector and the 30-pin header.

Most of the solder crosses tended to occur in the central portion of the board. During wave soldering the two edges across the board width are held in the conveyor fingers and the center along the 16 inch board length sags down toward the wave due to the soldering heat, the weight of the components, and the slight compression force of the conveyor fingers. As a consequence, the central portion of the board is typically immersed into the solder deeper than the two edges. Although all the above summary results are slightly mixed, the general trend tends to indicate that the deeper the board is immersed in the wave, or higher the wave setting, the more solder crosses can be expected.

Summarizing the results of the first experiment, the "bridging" in wave soldered THC was significantly reduced when using the parallelogram shaped solder thieving pads 30A, 30B with the THC components 10, 12 and 16 as compared to wave soldering the components without a soldering thieving pad, despite the THC leads being parallel to the solder wave during the wave soldering process. In wave soldering situations where component leads are perpendicular to the soldering wave, i.e. normal wave soldering, the final rows in the trailing edge of the component leads still align parallel to the solder wave. Thieving pads implement the principles of the present invention and should obtain same benefits of reduced "bridging" for perpendicular wave soldering components.

Figure 8:
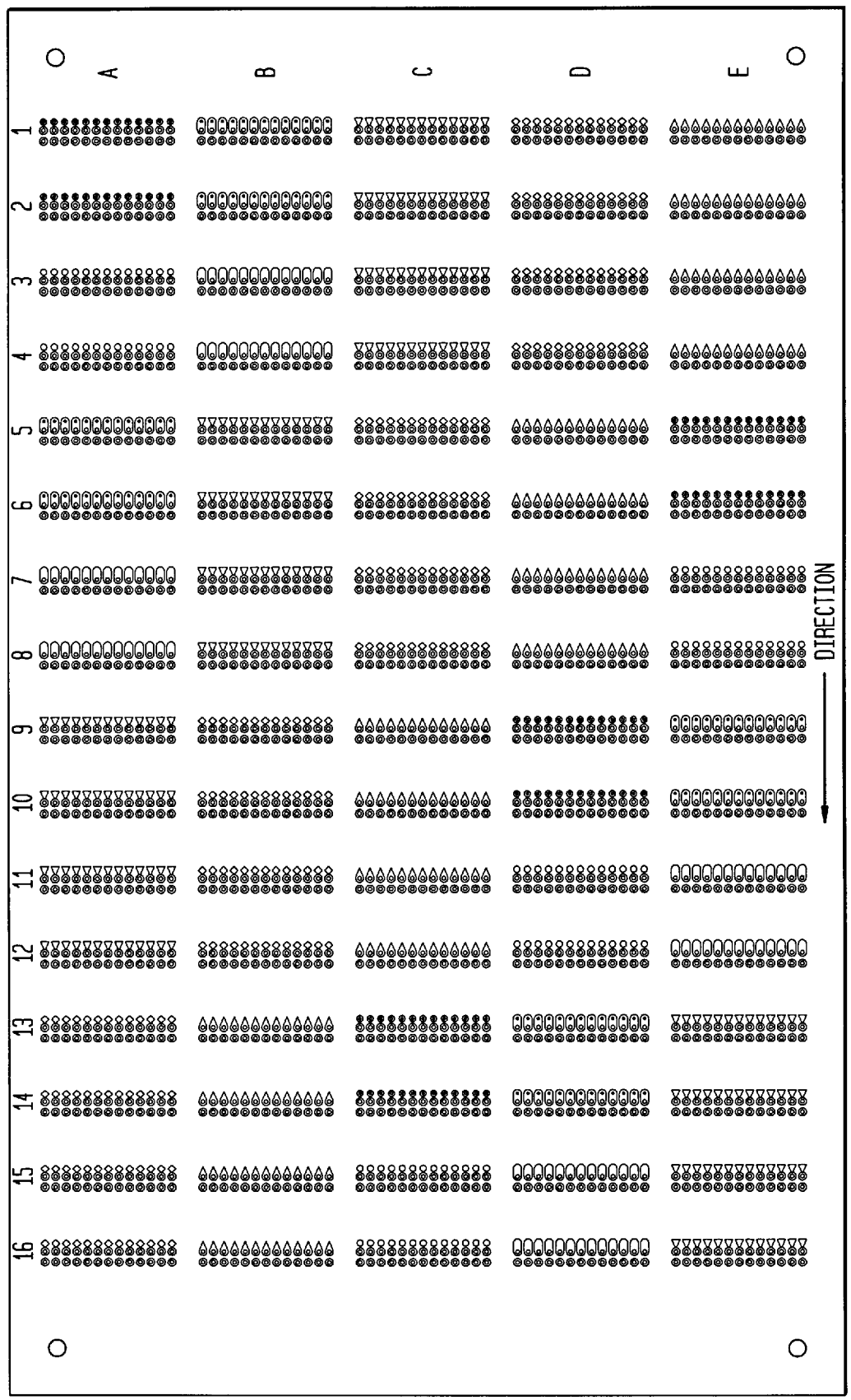
FIG. 8 is a photograph of a PWB with tell (10) different types of solder thieving pads and associated through holes for receiving eighty (80) THC components of a single type in another wave soldering experiment.
Figure 9:
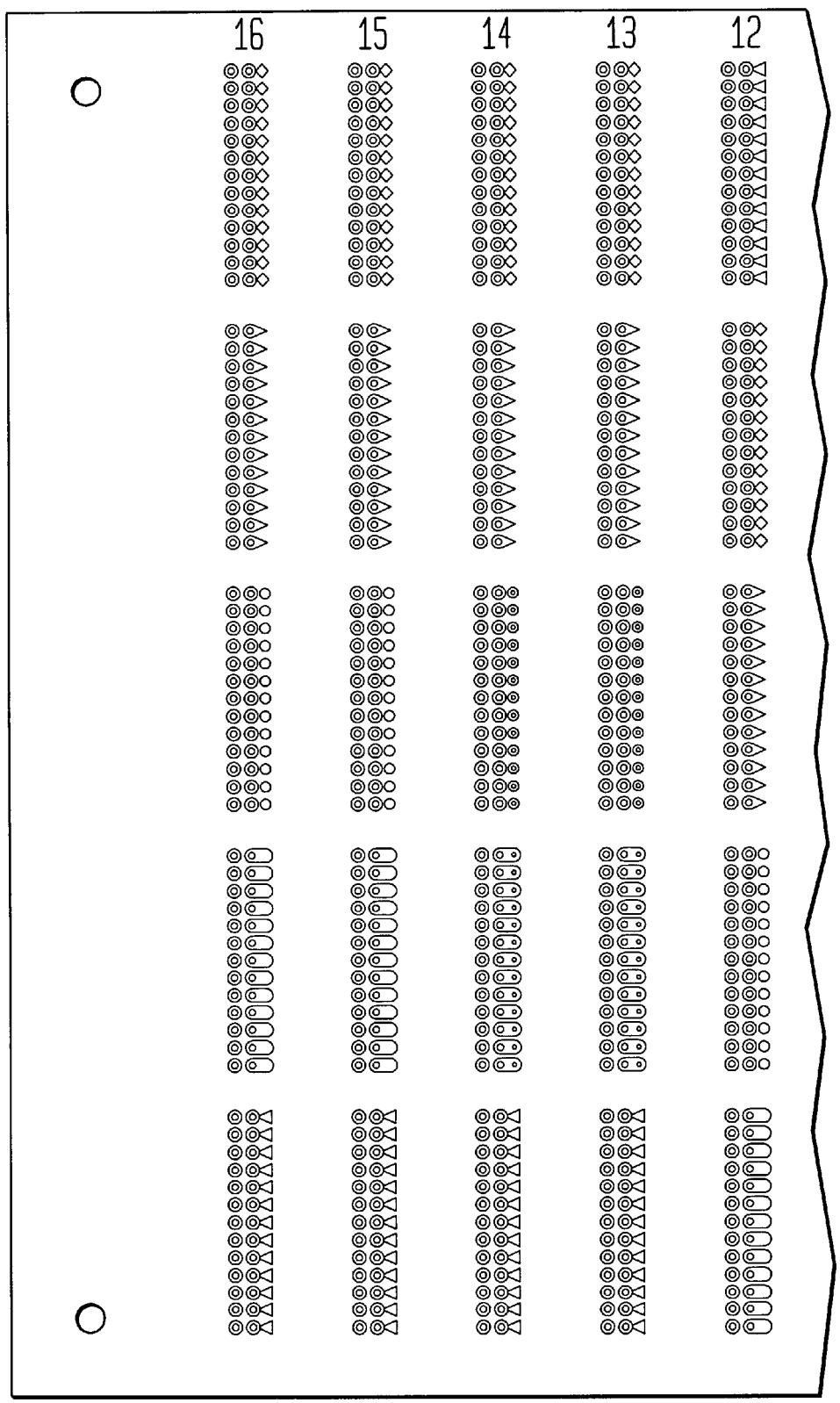
FIG. 9 is a photograph showing an enlarged view of ten (10) different types solder thieving pads of FIG. 8.
Figure 10:
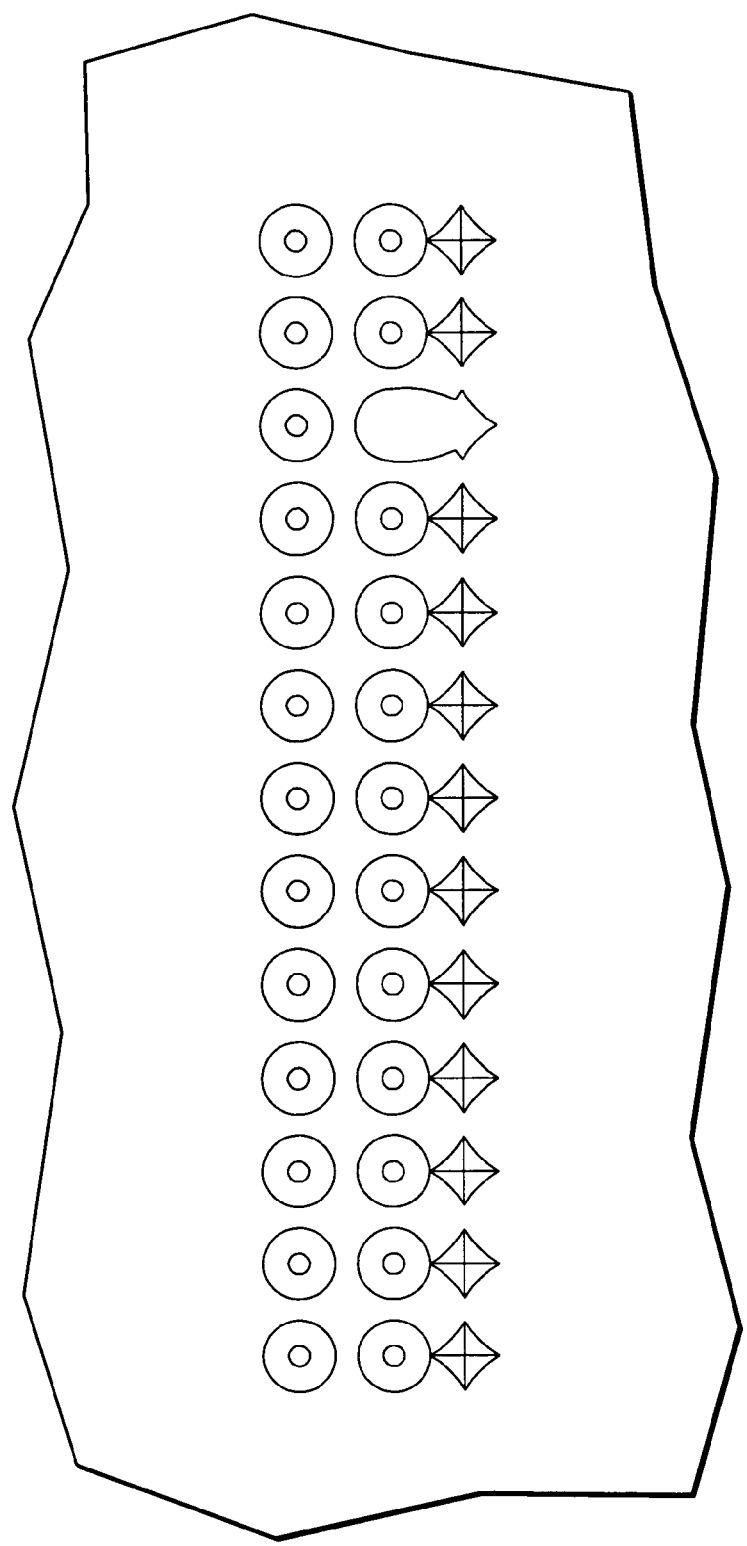
FIG. 10 is a photograph showing an enlarged view of a solder thieving pad similar to the present invention used in the experiment of FIG. 8.

In another experiment to be described in conjunction with FIGS. 8–10, ten (10 ) different types of solder thieving pads including a parallelogram shaped pad were compared in a wave soldering process similar to the soldering process described in conjunction with FIGS. 1–7.

FIG. 8 shows a PWB 800 fabricated to include 10 different types of solder thieving pad shapes. The pad shapes spread across the PWB to eliminate location effects. The PWB includes 16 columns, each column including 5 groups of through holes, each group of through hole supporting a 26-pin header. The solder thieving pads associated with the groups in FIG. 8 are identified by the following codes:

TABLE 1

| | |
|---|---|
| (a) | circle pad with via hole |
| (b) | elliptical pad with via hole |
| (c) | rev triangle with via hole |
| (d) | parallelogram pad with via hole |
| (e) | triangle with via hole |
| (f) | circle pad without via hole |
| (g) | elliptical pad w/out via hole |
| (h) | parallelogram pad w/out via hole |
| (i) | triangle w/out via hole |
| (j) | rev triangle w/out via hole |

The printed circuit board was wave soldered with two different processes. An Electrovert CoN$_2$tour® wave equipment employed an inert solder environment around the solder wave and a turbulent wave shape that flowed equally in both directions. The turbulent flow had previously been shown to reduce solder bridging defects and for other wave soldering applications. An Electrovert Ultrapak® was also used and had a comprehensive inert soldering enclosure from a preheater to the solder wave In contrast to the Electrovert CoN₂tour® wave it used the traditional "Quiet" Lambda wave. To achieve proper vertical hole fill, bare copper boards were run much deeper into the solder wave, typically resulting in higher bridging defects for components mounted parallel to the wave. Accordingly, the soldering set-up conditions represented the worst case for parallel formatted components. The specific details of two wave soldering processes A and B are shown below in Table 2:

TABLE 2

SOLDERING CONDITIONS BY PROCESS

| | A | B |
|---|---|---|
| Machine type | Electrovert CoN₂tour ® | Electrovert Ultrapak ® |
| Preheater #1 | 800° F. | 800° F. |
| Preheater #2 | 800° F. | 825° F. |
| PWB topside temp | 105° C. | 95° C. |
| Solder pot temp | 505° C. | 500° C. |
| Conveyor speed | 5.5 ft/min | 5 ft/min |
| Wave contact area | 1.5 inch | 2 inch |
| Flux type | low solid flux | low solid flux |
| Flux application | Spray | Spray |

FIG. 9 is a photograph of a portion of the printed wiring board 800. Specifically, columns 12-16 are shown with the thieving pads enlarged to obtain a better perspective of the shapes and location of the pads with respect to the through holes. Some thieving pads form an integrated part of their respective through hole pads, some slightly attached and some completely detached. The array of thieving pads enables the mechanics of molten solder drainage to be identified for the various thieving pads.

FIG. 10 is a photograph of a portion of a printed wiring board showing a parallelogram shaped thieving pad. Notice the condition of no solder bridging to neighboring leads and slightly excessive solder in one lead which is not a defect.

FIGS. 11A and B provide data on excessive solder and bridging defects for the various pad types in Table 1 by shape and location for the processes shown in Table 2. The data indicates that that the parallelogram pads (d) and (h) were superior to the other shapes employed in the experiment. In particular, the parallelogram shape was the most effective at the center of the board where the board sagged into the solder bath.

Summarizing, in two different experiments involving parallelogram shaped solder thieving pads for THC installed in PWBs, solder bridging defects was eliminated or reduced under the worst wave soldering condition, namely the THC leads being parallel to the solder wave, not perpendicular to the solder wave as is the typical industry practice. Parallelogram shaped thieving pads may be detached from the trailing edge of the through hole or attached to the through hole with or without a bridge. The parallelogram shape was selected as the best for balancing the volume of the excess solder in a joint, the dynamic solder flow in the wave and the solder surface tension to improve the drainage behavior of the solder.

While the invention has been shown and described in a preferred embodiment various changes can be made without departing from the spirit and scope of the invention as defined in the appended claims in which:

We claim:

1. A printed circuit board defining an array or multi arrays of through holes and including a component with multiple leads inserted in each array of through holes, comprising:

a wave soldered joint connecting the multi leaded component to the through hole; and a parallelogram shaped solder pad with corners disposed adjacent to the through holes for reducing bridging of the multiple leads during wave soldering of the multi leaded component to the board.

2. The printed circuit board of claim 1 further comprising:

an annular ring surrounding each through hole.

3. The printed circuit board of claim 2 further comprising:

a thin bridge interconnecting the parallelogram shaped solder pad with corners to the annular ring surrounding the through hole.

4. The printed circuit board of claim 1 wherein the parallelogram shaped solder pad with corners is a thieving pad.

5. The printed circuit board of claim 1 wherein the parallelogram shaped solder pad with corners is at the trailing direction of the wave soldering.

6. The printed circuit board of claim 1 wherein the multiple leads are parallel to the soldering wave at the time of the wave soldering.

7. The printed circuit board of claim 1 wherein the parallelogram shaped solder pad with corners is contiguous to the through hole.

8. The printed circuit board of claim 1 wherein the parallelogram shaped solder pad is a diamond shape.

9. A method for wave soldering a multi leaded component to a printed circuit board including an array or multi arrays of through holes to inhibit bridging between leads of the multi leaded component, comprising the steps of:

providing a parallelogram shaped solder pad adjacent to each through hole in the board;

installing the multi leaded component in the board; and wave soldering the multi leaded component to the board while the multiple leads are parallel to a solder wave during wave soldering.

10. The method of claim 9 further comprising the step of.

forming an annular ring about each through hole.

11. The method of claim 10 further comprising the step of forming a thin bridge interconnecting the parallelogram shaped pad and the annular ring.

12. The method of claim 9 further comprising the step of:

forming the parallelogram shaped solder pad contiguous to each through hole.

13. The method of claim 9 further comprising tile step of:

forming the parallelogram shaped solder pad at the trailing direction of the wave soldering.

14. The method of claim 9 wherein the parallelogram shaped solder pad is a solder thieving pad.

15. The method of claim 9 further comprising the step of:

wave soldering the multi leaded component to the board while the multi leads are perpendicular to the solder wave during wave soldering.

16. The method of claim 9 wherein the parallelogram shaped solder pad is a diamond shape.

17. The method of claim 9 wherein the multi leaded component is surface mounted to the board.

18. A printed circuit board defining an array or multi arrays of through holes and including a component with multiple leads inserted in each array of through holes in a wave soldering process, comprising:

a wave soldered joint connecting the multi leaded component to the through hole;

an annular ring surrounding each through hole, a parallelogram shaped solder thieving pad disposed adjacent to the through holes; the multiple leads being parallel to and at the trailing direction of a solder wave at the time of the wave soldering; and a thin bridge interconnecting the parallelogram shaped solder thieving pad to the annular ring surrounding the through hole whereby bridging of the multiple leads is reduced in the wave soldering process.

19. A method for wave soldering a multi leaded component to a printed circuit board including an array or multi arrays of through holes to inhibit bridging between leads of the multi leaded component, comprising the steps of:

forming an annular ring about each through hole providing a parallelogram shaped solder thieving pad adjacent to each through hole in the board;

forming a thin bridge interconnecting the parallelogram shaped pad and the annular ring;

installing the multi leaded component in the board; and wave soldering the multi leaded component to the board while the multiple leads are parallel to and the parallelogram shaped thieving pad is at the trailing direction of a solder wave during wave soldering.

20. The method of claim 19 further comprising the step of:

wave soldering the multi leaded component to the board while the multi leads are perpendicular to the solder wave during wave soldering.

* * * * *